(12) United States Patent
Mizuno et al.

(10) Patent No.: US 7,161,382 B2
(45) Date of Patent: Jan. 9, 2007

(54) GENERAL-PURPOSE LOGIC CELL, GENERAL-PURPOSE LOGIC CELL ARRAY USING THE SAME, AND ASIC USING GENERAL-PURPOSE LOGIC CELL ARRAY

(75) Inventors: Masaharu Mizuno, Kanagawa (JP); Tooru Fujii, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 59 days.

(21) Appl. No.: 10/438,012

(22) Filed: May 15, 2003

(65) Prior Publication Data
US 2003/0214323 A1    Nov. 20, 2003

(30) Foreign Application Priority Data
May 20, 2002 (JP) .............................. 2002-144354

(51) Int. Cl.
*H03K 19/177*    (2006.01)
(52) U.S. Cl. .......................................... 326/41; 326/47
(58) Field of Classification Search ............ 326/37–41, 326/47
See application file for complete search history.

(56) References Cited

U.S. PATENT DOCUMENTS

| | | | |
|---|---|---|---|
| 4,910,417 A | 3/1990 | El Gamal et al. | |
| 5,055,718 A | 10/1991 | Galbraith et al. | |
| 5,225,718 A | 7/1993 | Seshita et al. | |
| 5,243,208 A | 9/1993 | Isomura et al. | |
| 5,457,410 A | 10/1995 | Ting | |
| 5,646,558 A | 7/1997 | Jamshidi | |
| 5,684,412 A | 11/1997 | Yoeli et al. | |
| 5,898,636 A | 4/1999 | Isomura et al. | |
| 5,920,089 A | 7/1999 | Kanazawa et al. | |
| 5,955,912 A | 9/1999 | Ko | |
| 6,014,038 A | 1/2000 | How et al. | |
| 6,020,772 A | 2/2000 | Hayashi et al. | |
| 6,278,148 B1 | 8/2001 | Watanabe et al. | |
| 6,300,793 B1 * | 10/2001 | Ting et al. | 326/41 |
| 6,356,118 B1 | 3/2002 | Rikino et al. | |
| 6,396,087 B1 | 5/2002 | Kitabayashi et al. | |
| 6,580,289 B1 * | 6/2003 | Cox | 326/40 |
| 6,674,307 B1 | 1/2004 | Mizuno | |
| 6,873,185 B1 * | 3/2005 | Cox | 326/47 |
| 2002/0047727 A1 | 4/2002 | Mizuno | |

(Continued)

FOREIGN PATENT DOCUMENTS

EP    0 343 968 A2    11/1989

(Continued)

OTHER PUBLICATIONS

U.S. Appl. No. 10/437,391 (projected publication date: Nov. 20, 2003).

*Primary Examiner*—James H. Cho
(74) *Attorney, Agent, or Firm*—Sughrue Mion, PLLC

(57) ABSTRACT

A general-purpose logic cell used in a general-purpose logic cell array for a logic circuit, includes a plurality of kinds of logic circuit elements, each of which has a plurality of terminals with no connection. The plurality of kinds of logic circuit elements includes a flip-flop and a first inverter set. In this case, each of first inverters of the first inverter set is possible to be connected with an input of the flip-flop in parallel or as one of a series connection of at least two of the first inverters. Also, each first inverter is possible to be connected with an output of the flip-flop in parallel or as one of a series connection of at least two of the first inverters.

19 Claims, 9 Drawing Sheets

U.S. PATENT DOCUMENTS

| | | | |
|---|---|---|---|
| 2003/0173642 A1* | 9/2003 | Mizuno | 257/512 |
| 2003/0201798 A1 | 10/2003 | Mizuno | |
| 2003/0234666 A1* | 12/2003 | Cox | 326/38 |

FOREIGN PATENT DOCUMENTS

| | | |
|---|---|---|
| EP | 0 426 283 A2 | 5/1991 |
| EP | 0 776 093 A2 | 5/1997 |
| JP | 1-204445 A | 8/1989 |
| JP | 2-68951 A | 3/1990 |
| JP | 02-222217 A | 9/1990 |
| JP | 5-167048 A | 7/1993 |
| JP | 09-116124 A | 5/1997 |
| JP | 09-148916 A | 6/1997 |
| JP | 10-223902 A | 8/1998 |
| JP | 11-265998 A | 9/1999 |
| TW | 308696 | 6/1997 |
| WO | 91/07015 A1 | 5/1991 |

* cited by examiner

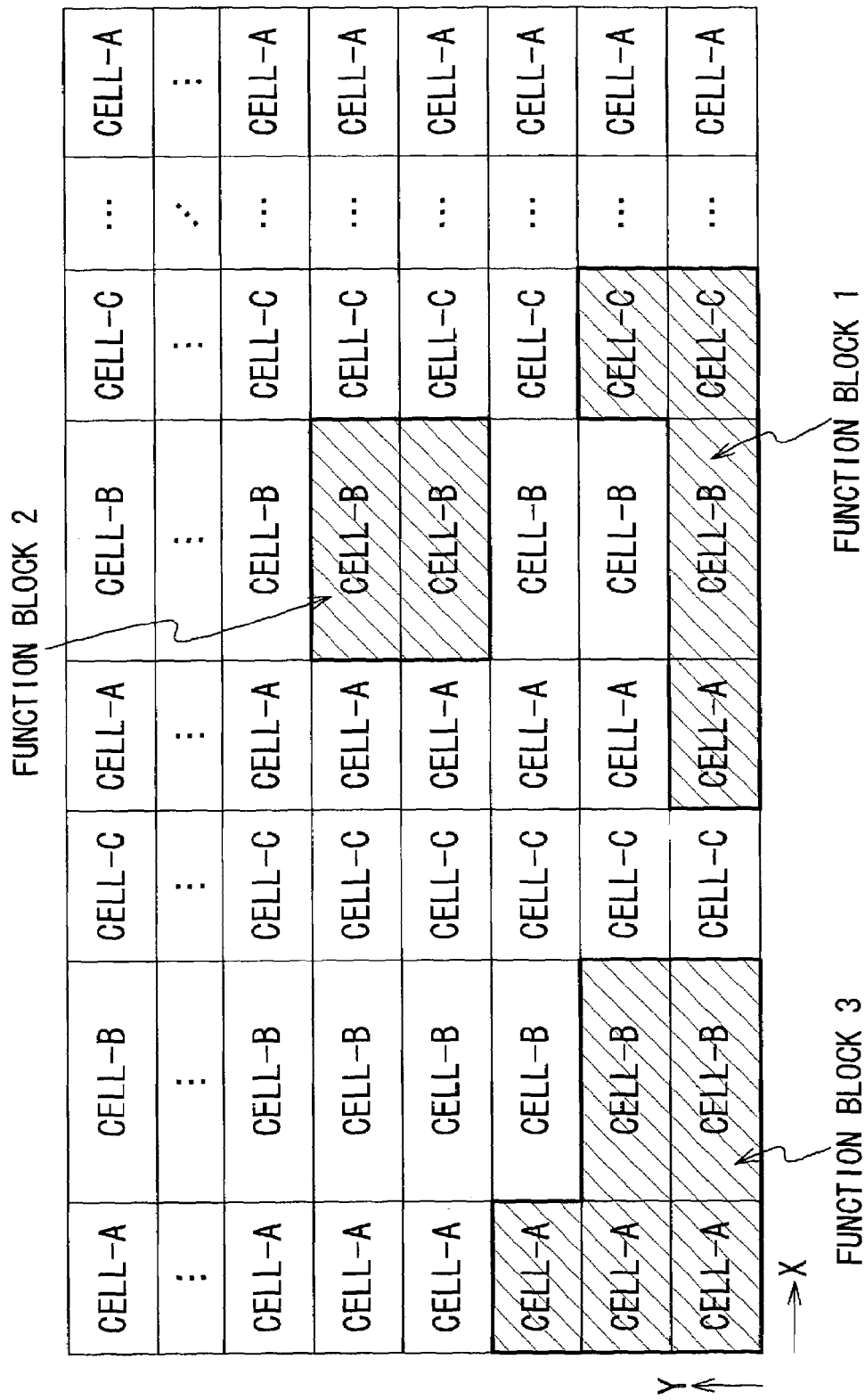

GENERAL-PURPOSE LOGIC CELL, GENERAL-PURPOSE LOGIC CELL ARRAY USING THE SAME, AND ASIC USING GENERAL-PURPOSE LOGIC CELL ARRAY

BACKGROUND OF THE INVENTION

1. Field of the Invention

The present invention relates to a general-purpose logic cell, a general-purpose logic cell array in which the general-purpose logic cells are formed in an array, and an ASIC using the general-purpose logic cell array.

2. Description of the Related Art

A cell array is conventionally known, from which a logic circuit is formed by forming a wiring line layer for connecting a plurality of cells on a lower layer in which the plurality of cells are arranged in an array. Thus, a semiconductor integrated circuit device with a desired function can be manufactured.

As such a cell array, for example, a cell array of a gate array type (hereinafter, to be referred merely to as "a gate array") is known in which basic cells are arranged in an array. In the gate array, a lower layer is prepared in which the basic cells are arranged but wiring lines are not formed. All the connections are accomplished by forming a wiring line pattern in a wiring line layer which is formed in accordance with a logic circuit designed by a user. According to the gate array, the application of the basic cells is determined based on the logic circuit designed by the user. Therefore, transistors with a large size having high drive ability are adopted as transistors of the basic cell, in order to make the basic cells applicable to all the applications. As a result, a high gate density and low power consumption are hindered.

For this reason, a cell array is developed for a semiconductor device in which an exclusive use cell is optimized for a specific logic circuit, e.g., a flip-flop circuit. The cells are provided for a lower layer, and the exclusive use cells are primarily allocated to the flip-flop contained in the logic circuit designed by the user. For example, Japanese Laid Open Patent Application (JP-A-Heisei 11-265998) describes a semiconductor device and a manufacturing method suitable to form a semiconductor device desired electric circuit by a automatic arrangement wiring method. As shown in FIG. 1, the semiconductor device has a transistor forming area in which a specific function bank of transistors which are optimized for a flip-flop circuit, and a general-purpose function bank having a transistor arrangement in accordance with a conventional gate array method are alternately provided.

According to the semiconductor device disclosed in Japanese Laid Open Patent Application (JP-A-Heisei 11-265998), it has advantages that the semiconductor device can be formed in a high gate density to have low power consumption, since the transistors of the exclusive use cell optimized for the flip-flop circuit are not necessary to have high drive ability unlike the transistors of the previous basic cell.

However, in the technique disclosed in the Japanese Laid Open Patent Application (JP-A-Heisei 11-265998), there is a case where a defect is found in the logical function of a logic circuit in the process after an arrangement process when the logic circuit designed by the user is formed in the lower layer, or a case a defect is found that a timing condition is not met because of shortage of a setup time or a hold time of the flip-flop. In such a case, if no elements necessary for repairing are in the neighborhood of at a defect portion, it is necessary to carry out the processes from the arrangement process again. As a result, the term of development of the semiconductor device becomes long and the development cost becomes high.

In conjunction with the above description, a gate array is described in Japanese Laid Open Patent Application (JP-A-Heisei 5-167048). In this conventional example, a plurality of NAND circuit cells or NOR circuit cells are formed with no wiring connection. By connecting the inputs or outputs of these circuits, a desired circuit is formed.

SUMMARY OF THE INVENTION

Therefore an object of the present invention is to provide a general-purpose logic cell, a general-purpose logic cell array using the same, and an ASIC using the general-purpose logic cell array, in which a semiconductor device containing a logic circuit designed by a user can be developed in a short time and in a low cost.

In an aspect of the present invention, a general-purpose logic cell used in a general-purpose logic cell array for a logic circuit, includes a plurality of kinds of logic circuit elements, each of which has a plurality of terminals with no connection.

Here, the plurality of kinds of logic circuit elements may include a flip-flop and a first inverter set. In this case, the first inverter set may include first inverters, each of which is possible to be connected with an input of the flip-flop in parallel or as one of a series connection of at least two of the first inverters. An input transistor of each of the first inverters desirably has a smaller size and a smaller capacitance than an output transistor of the flip-flop.

Also, the first inverter set may include first inverters, each of which is possible to be connected with an output of the flip-flop in parallel or as one of a series connection of at least two of the first inverters. In this case, an output transistor of each of the first inverters desirably has a size and capacitance equal to or larger than an output transistor of the flip-flop. The first inverters have different drive abilities.

Also, the plurality of kinds of logic circuit elements may further include a second inverter set. In this case, the second inverter set may include second inverters, each of which is possible to be connected with an output of the flip-flop in parallel or as one of a series connection of at least two of the second inverters. An output transistor of each of the second inverters desirably has a size and capacitance equal to or larger than an output transistor of the flip-flop. Also, the second inverters have different drive abilities.

In another aspect of the present invention, a general-purpose logic cell array for a logic circuit, may include. a plurality of kinds of general-purpose logic cells. Each of the plurality of kinds of general-purpose logic cells may be arranged in a line in a first direction. The general-purpose logic cell may include a plurality of kinds of logic circuit elements, each of which has a plurality of terminals with no connection.

In this case, the plurality of kinds of general-purpose logic cells are desirably circularly arranged in a second direction orthogonal to the first direction. Also, one of the plurality of kinds of general-purpose logic cells is a selector with a middle signal terminal. Also, one of the plurality of kinds of general-purpose logic cells is an inverter set.

Also, the plurality of kinds of logic circuit elements may include a flip-flop and a first inverter set. In this case, the first inverter set may include first inverters, each of which is possible to be connected with an input of the flip-flop in parallel or as one of a series connection of at least two of the first inverters. Also, the plurality of kinds of logic circuit elements may further include a second inverter set. Also, the second inverter set may include second inverters, each of which is possible to be connected with an output of the flip-flop in parallel or as one of a series connection of at least two of the second inverters.

Also, the first inverter set may include first inverters, each of which is possible to be connected with an output of the flip-flop in parallel or as one of a series connection of at least two of the first inverters.

In another aspect of the present invention, an ASIC includes a general-purpose logic cell array, which may include the plurality of kinds of general-purpose logic cells formed on a semiconductor substrate in an array; and a wiring line layer which connects the plurality of kinds of general-purpose logic cells to produce a desired logic circuit. Each of the plurality of general-purpose logic cells may include a plurality of kinds of logic circuit elements, each of which has a plurality of terminals with no connection.

In another aspect of the present invention, a method of manufacturing an ASIC is achieved by forming a lower layer in which a plurality of kinds of general-purpose logic cells are formed on a semiconductor substrate in an array, each of circuit elements of the plurality of kinds of general-purpose logic cells having no connection; and by forming an upper wiring line layer which connects the plurality of kinds of general-purpose logic cells to form a desired logic circuit.

Here, the step of forming a lower layer may be achieved by forming MOS transistors on the semiconductor substrate for each of the plurality of kinds of general-purpose logic cells; and by forming a lower wiring line layer to connect the MOS transistors such that each of circuit elements of the plurality of kinds of general-purpose logic cells has no connection.

Also, the step of forming a lower wiring line layer may be achieved by forming the lower wiring line layer such that one of the plurality of kinds of general-purpose logic cells includes a flip-flop and a first inverter set.

Also, the first inverter set may include first inverters, one or more connected in series of which are possible to be connected with an input of the flip-flop in series. Also, the step of forming a lower wiring line layer may be achieved by forming the lower wiring line layer such that one of the plurality of kinds of general-purpose logic cells further includes a second inverter set of second inverters.

BRIEF DESCRIPTION OF THE DRAWINGS

FIG. 9 is a diagram showing the general-purpose logic cell array according to a second embodiment of the present invention;

DESCRIPTION OF THE PREFERRED EMBODIMENTS

Hereinafter, a general-purpose logic cell array of the present invention will be described in detail with reference to the attached drawings.

(First Embodiment)

In a general-purpose logic cell array, MOS transistors formed on a semiconductor substrate for each of basic cells called general-purpose logic cells, and the MOS transistors of each general-purpose logic cell are electrically connected by using a lower wiring line layer of, for example, three layers. Thus, the general-purpose logic cell array is formed. Next, an upper wiring line layer of, for example, two layers is formed on the general-purpose logic cell array as a lower layer in accordance with a logic circuit designed by a user, to connect the above general-purpose logic cells electrically. Thus, an LSI (large-scaled integrated circuit) containing the logic circuit designed by the user is manufactured. Such an LSI is called "ASIC (Application Specific IC)" in this specification.

Figure 1:
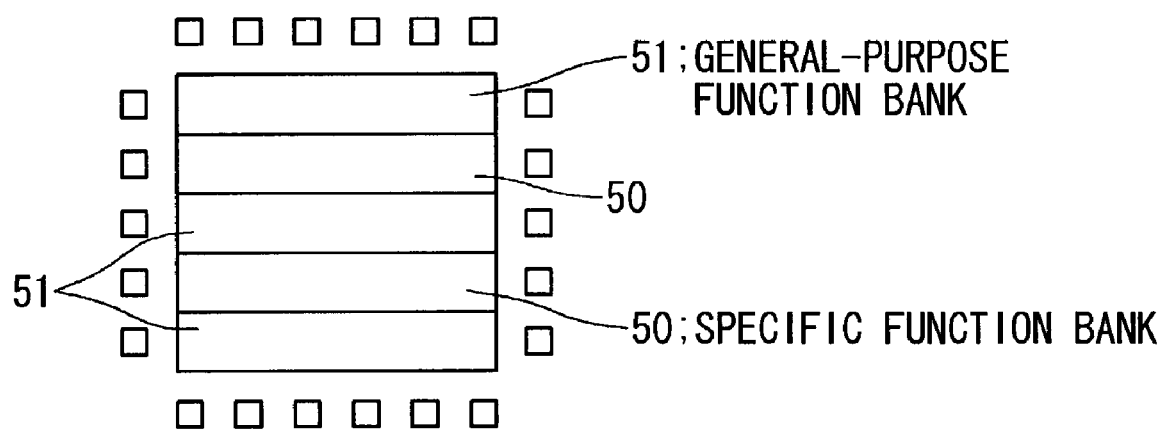
FIG. 1 is a diagram showing a conventional cell array.
Figure 2:
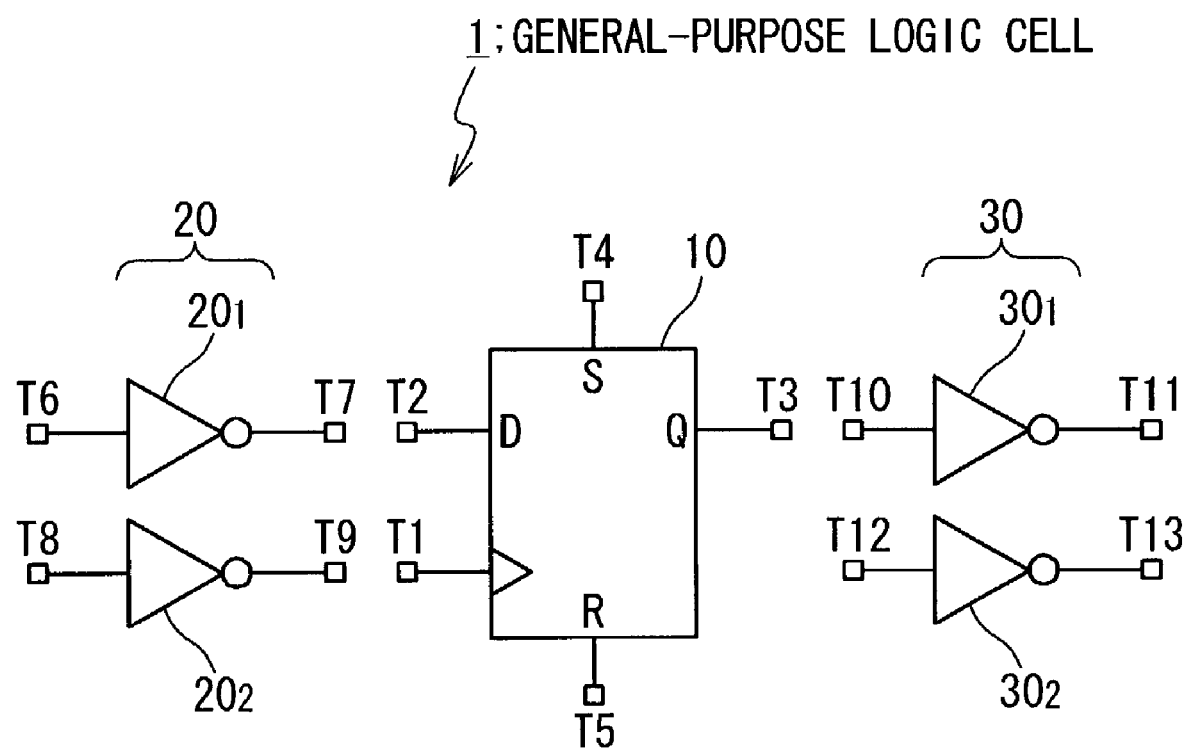
FIG. 2 is a circuit diagram showing the structure of a general-purpose logic cell according to a first embodiment of the present invention.

FIG. 2 is a diagram showing the structure of the general-purpose logic cell 1 as a unit module, which is used, as a flip-flop cell according to the first embodiment of the present invention. The general-purpose logic cell 1 is composed of a flip-flop 10, a first inverter set 20 and a second inverter 30. The inverter sets 20 and 30 are used to switch the function of the flip-flop 10.

The flip-flop 10 is composed of a D-type flip-flop. A clock terminal of the flip-flop 10 is connected with a node T1, a data input terminal D is connected with a node T2, an output terminal Q is connected with a node T3, a set terminal S is connected with a node T4 and a reset terminal R is connected with a node T5. The nodes T1 to T5 have no connection and are possible to be connected in the upper wiring line layer. A MOS transistor with a relatively small size and a small input capacity is used for the transistor of the data input terminal D of the flip-flop 10. A MOS transistor with a smaller size and a smaller input capacity is used for the transistor of a clock terminal. Also, a MOS transistor with a relatively large size and a relatively large drive ability is used for the transistor of the output terminal Q of the flip-flop 10. In this way, the optimization of the flip-flop is accomplished in this structure. That is, a clock signal supplied to the flip-flop is a signal which always changes. The size of the MOS transistor to which the clock signal is supplied is made small to realize low input capacity and low power consumption of the flip-flop.

The first inverter set 20 is composed of inverters 201 and 202. Each of the inverters 201 and 202 is composed of a plurality of MOS transistors connected by the lower wiring line layer. The inverters 201 and 202 are provided for purpose of changing the timing and level of a signal supplied to the flip-flop 10. Therefore, the large drive ability is not needed for the inverters, and the inverters are formed of MOS transistors with a relatively smaller size and a relatively smaller input capacity, compared with the output transistor of the flip-flop. Thus, the optimization of the inverter is accomplished. The input terminal of the inverter 201 is connected with a node T6 and the output terminal is connected with a node T7. In the same way, the input terminal of the inverter 202 is connected with a node T8 and the output terminal is connected with a node T9. The nodes T6 to T9 have no connection and are possible to be connected in the upper wiring line layer.

The second inverter set 30 is composed of inverters 301 and 302. Each of the inverters 301 and 302 is composed of a plurality of MOS transistors connected by the lower wiring line layer. Each of the inverters 301 and 302 is composed of a plurality of MOS transistors connected in the lower wiring line layer. The inverters 301 and 302 are provided for purpose of compensation of a lack of the drive ability of the flip-flop 10 and the change of a signal level. Therefore, the inverters are formed of MOS transistors with a large size and a large drive ability, compared with the output transistor of the flip-flop. Also, the drive abilities of the inverters 301 and 302 may be different from each other. Thus, the optimization of the inverters is accomplished. The input terminal of the inverter 301 is connected with a node T10 and the output terminal is connected with a node T11. In the same way, the input terminal of the inverter 302 is connected with a node T12 and the output terminal is connected with a node T13. The nodes T10 to T13 have no connection and are possible to be connected by the upper wiring line layer.

Figure 3:
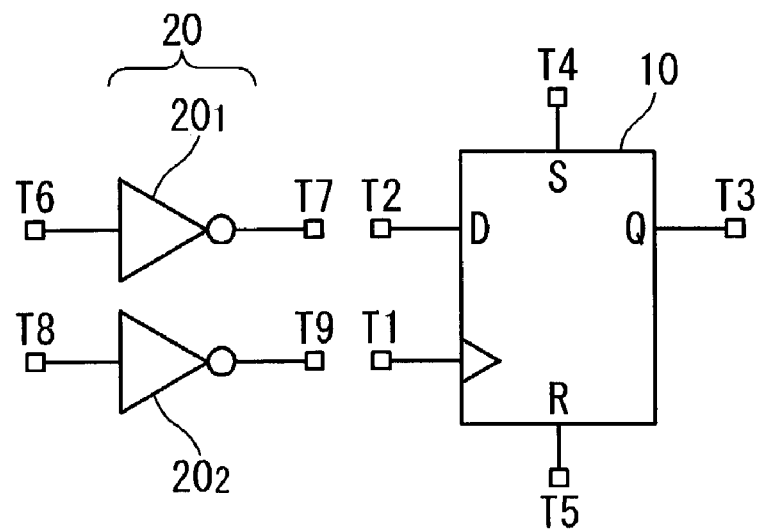
FIG. 3 is a circuit diagram showing a modification example of the general-purpose logic cell according to the first embodiment of the present invention.
Figure 4:
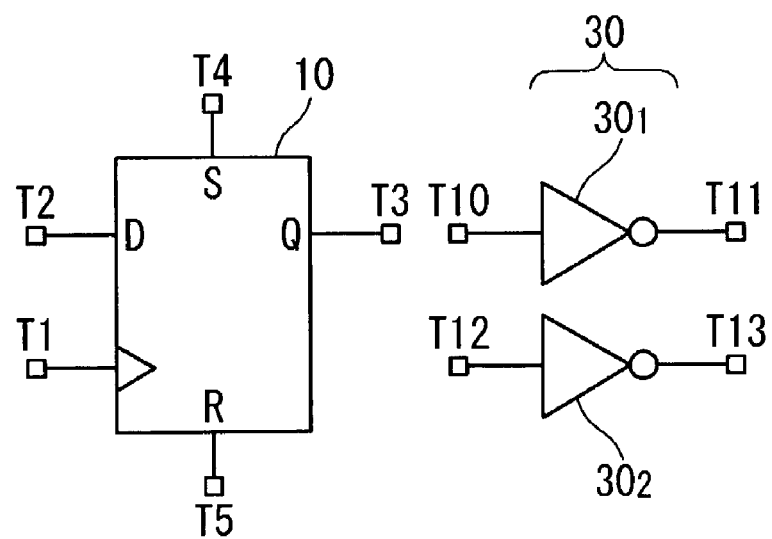
FIG. 4 is a circuit diagram showing another modification example of the general-purpose logic cell according to the first embodiment of the present invention.

It should be noted that the above-mentioned general-purpose logic cell 1 is composed of the flip-flop 10, the input side inverter set 20 of the two inverters 201 and 202 formed from the MOS transistors of relatively small size and the output side inverter set 30 of the two inverters 301 and 302 formed of MOS transistors of a relatively large size. However, the general-purpose logic cell 1 according to the present invention is not always limited to the above-mentioned structure. For example, the general-purpose logic cell 1 may be formed of the flip-flop 10 and the two inverters 201 and 202 formed of the MOS transistors of the relatively small size, as shown in FIG. 3. Also, the general-purpose logic cell 1 may be formed of one flip-flop 10 and two inverters 301 and 302 formed of the MOS transistors of the relatively large size, as shown in FIG. 4. Also, the number of inverters contained in the input side inverter set 20 or output side inverter set 30 is not limited to two, and is optional. Moreover, the other circuits such as a NAND gate and a NOR gate can be used instead of the above inverters 201, 202, 301 and 302.

Next, a use example of the general-purpose logic cell 1 with the above-mentioned structure will be described. The general-purpose logic cell 1 shown in FIG. 2 can be used just as it is as a usual flip-flop. In this case, the clock signal terminal is the node T1, the data input terminal D is the node T2, the output terminal Q is the node T3 and the set terminal S is the node T4 and the reset terminal R is the node T5. Each node is connected by a wiring pattern in the upper wiring line layer in accordance with the logic circuit designed by the user.

Figure 5:
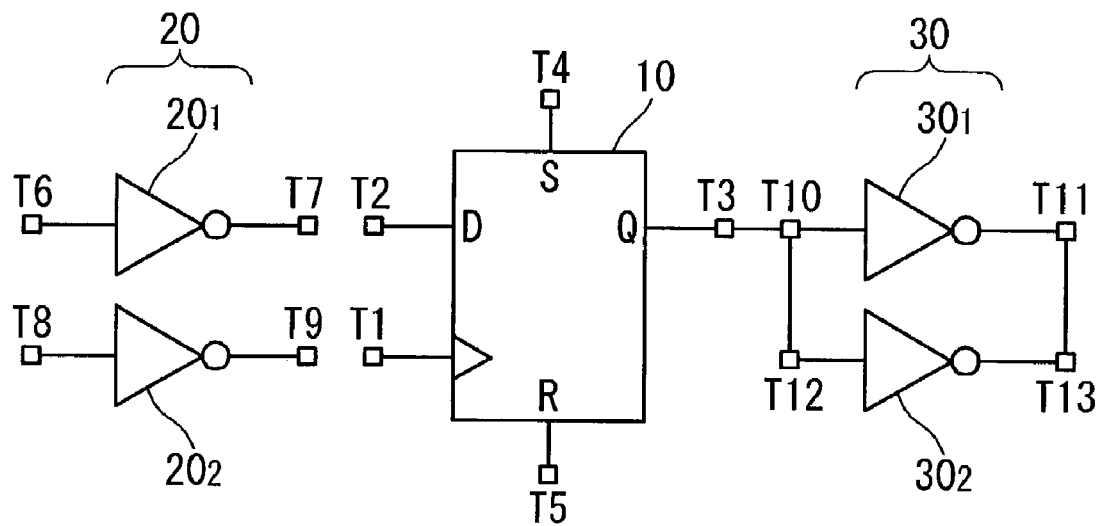
FIG. 5 is a circuit diagram showing a use example of the general-purpose logic cell according to the first embodiment of the present invention.

FIG. 5 shows a use example when the lack of the drive ability of the flip-flop 10 is compensated. In the case, the nodes T3, T10 and T12 are connected to each other by a wiring pattern in the upper wiring line layer and the nodes T11 and T13 are connected by a wiring pattern in the upper wiring line layer. Through the connection, the flip-flop 10 can be used as a flip-flop, which has its drive ability and drive abilities of the inverters 301 and 302. In case of this use example, the clock signal terminal is the node T1, the data input terminal D is the node T2, the output terminal Q is the node T11 or T13 and the set terminal S is the node T4 and the reset terminal R is the node T5. Each node is connected by a wiring pattern in the upper wiring line layer in accordance with the logic circuit designed by the user.

Figure 6:
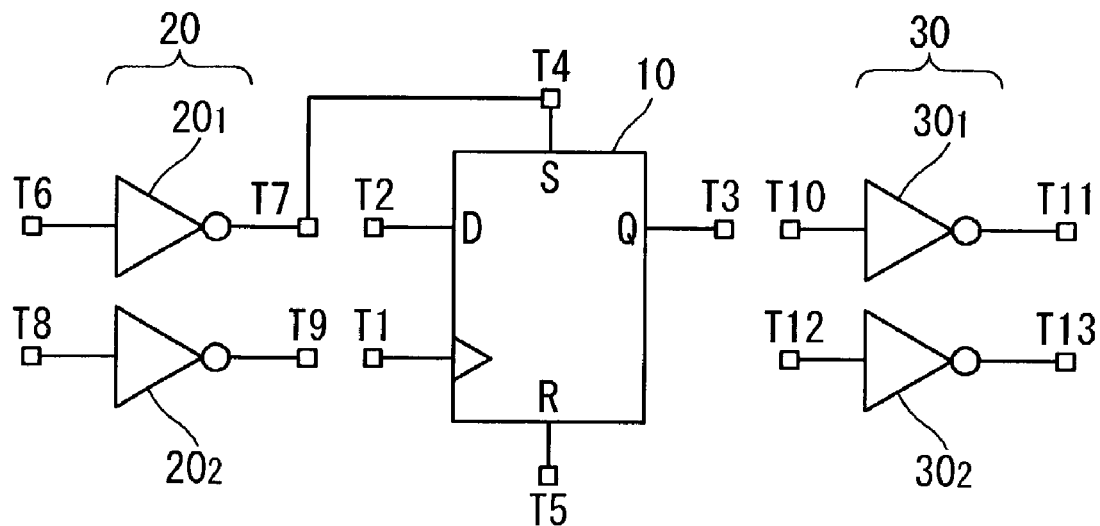
FIG. 6 is a circuit diagram showing another use example of the general-purpose logic cell according to the first embodiment of the present invention.

FIG. 6 shows an example when the flip-flop 10 is used as a flip-flop which has an inversion set logic. In this case, the node T7 and the node T4 are connected. Through the connection, the flip-flop 10 can be used as a flip-flop, which can be compulsively set, based on a signal of a low (L) level supplied to the node T6. In case of this use example, the clock signal terminal is the node T1, the data input terminal D is the node T2, the output terminal Q is the node T3, the set terminal S is the node T6 and the reset terminal R is the node T5. Each node is connected by a wiring pattern in the upper wiring line layer in accordance with the logic circuit designed by the user.

Figure 7:
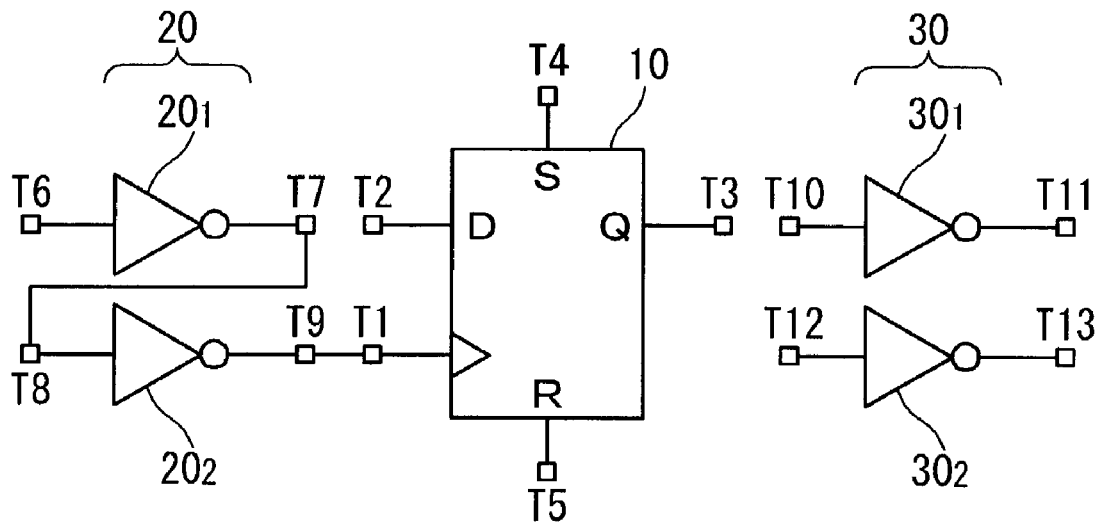
FIG. 7 is a circuit diagram showing another use example of the general-purpose logic cell according to the first embodiment of the present invention.

FIG. 7 shows a use example when the setup time of the flip-flop 10 should be sufficiently secured. In this case, the node T7 and the node T8 are connected and the node T9 and the node T1 are connected. Through the connections, the signal supplied to the clock signal terminal of the flip-flop 10 is delayed. Therefore, the change of the clock signal to the signal supplied to the data input terminal D is relatively delayed, and the setup time can be secured. In case of this use example, the clock signal terminal is the node T6, the data input terminal D is the node T2, the output terminal Q is the node T3, the set terminal S is the node T4, and the reset terminal R is the node T5. Each node is connected by a wiring pattern in the upper wiring line layer in accordance with the logic circuit designed by the user.

Figure 8:
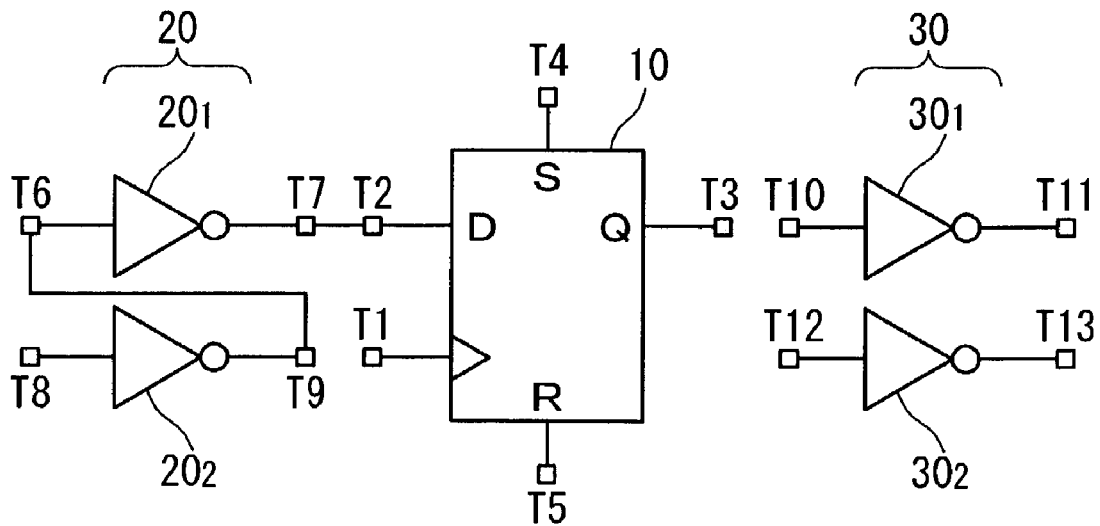
FIG. 8 is a circuit diagram showing another use example of the general-purpose logic cell according to the first embodiment of the present invention.

FIG. 8 shows a use example when the hold time of the flip-flop 10 should be sufficiently secured. In this case, the node T6 and the node T9 are connected and the node T7 and the node T2 are connected. Through the connections, a signal supplied to the data input terminal D of the flip-flop 10 is delayed. Therefore, a change of the clock signal to a signal supplied to the data input terminal D goes ahead relatively and the fold time can be secured. In case of this use example, the clock signal terminal is the node T1, the data input terminal D is the node T8, the output terminal Q is the node T3, the set terminal S is the node T4, and the reset terminal R is the node T5. Each node is connected by a wiring pattern in the upper wiring line layer in accordance with the logic circuit designed by the user.

As described above, some use examples of the general-purpose logic cell according to the first embodiment of the present invention are shown. However, the function of the flip-flop 10 may be changed to have various functions through connections other than the above connections, of course.

According to the general-purpose logic cell according to the first embodiment of the present invention, it is possible to switch the plurality of functions in one general-purpose logic cell 1. Also, in case that the logic circuit designed by the user is achieved by the upper wiring line layer formed on the lower layer, an defect can be corrected even if the defect occurs in the process after the arrangement process. Therefore, it is possible to shorten a development term of the semiconductor device and to reduce the development cost. Also, even if the function of one general-purpose logic cell 1 is switched between the flip-flop functions, the wiring line length is short so that efficiency lowering can be prevented.

(Second Embodiment)

The general-purpose logic cells 1 according to the above-mentioned first embodiment are used for the general-purpose logic cell array. FIG. 9 is a diagram showing the structure of the general-purpose logic cell array containing the general-purpose logic cells 1. The general-purpose logic cell array is composed of three kinds of general-purpose logic cells such as a general-purpose logic cell CELL-A, a general-purpose logic cell CELL-B and a general-purpose logic cell CELL-C.

Each of the general-purpose logic cell CELL-A, the general-purpose logic cell CELL-B and the general-purpose logic cell CELL-C is arranged in one line in Y-axis direction, and they are arranged circularly in the order of the general-purpose logic cell CELL-A, the general-purpose logic cell CELL-B and the general-purpose logic cell CELL-C in the X-axis direction.

It should be noted that in FIG. 9, an example of the general-purpose logic cell array is shown in which the ratio of the general-purpose logic cell CELL-A, the general-purpose logic cells CELL-B and the general-purpose logic cells CELL-C is CELL-A:CELL-B:CELL-C=1:1:1. However, the ratio may be optionally set.

Figure 10A:
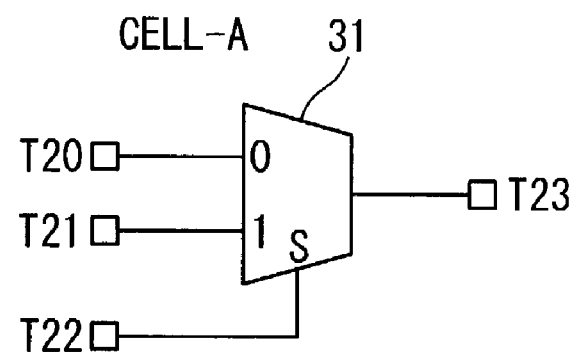
FIGS. 10A and 10B are circuit diagrams showing the general-purpose logic cells used in the general-purpose logic cell array according to the second embodiment of the present invention, respectively.

For example, the general-purpose logic cell CELL-A is composed of a selector 31, as shown in FIG. 10A. A first input terminal 0 of the selector 31 is connected with a node T20, a second input terminal 1 is connected with a node T21, a selection control terminal S is connected with a node T22 and an output terminal is connected with a node T23. Although illustration is omitted, the selector 31 is formed by connecting a plurality of MOS transistors by the lower wiring line layer. The nodes T20 to T23 are connected by a wiring pattern in the upper wiring line layer in accordance with the logic circuit designed by the user.

A MOS transistor with a relatively small size and a small input capacity is used for the transistors of the first input terminal 0, second input terminal 1 and selection input terminal S of the selector 31. A MOS transistor with a relatively large size and a relatively large drive ability is used for the transistor of the output terminal. Thus, the optimization of the selector 31 is accomplished.

It should be noted that as the general-purpose logic cell CELL-A, a selector disclosed in Japanese Patent Application No. 2000-349627 may be used. The selector is formed such that inverters receive a signal supplied to the first input terminal 0 and a signal supplied to the second input terminal 1 and the outputs of the inverters are drawn out as signals at middle nodes. If the selector is used, a gate circuit operating at a high speed can be formed of a few numbers of the wiring lines.

Figure 10B:
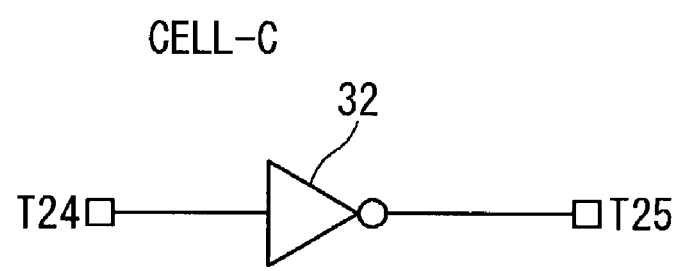

The general logic cell CELL-B is formed from the general-purpose logic cell 1 containing the flip-flop shown in FIG. 2. For example, the general-purpose logic cell CELL-C is composed of an inverter 32 as shown in FIG. 10B. An input terminal of the inverter 32 is connected with a node T24 and an output terminal is connected with a node T25. Although illustration is omitted, the inverter 32 is formed by connecting a plurality of MOS transistors by the lower wiring line layer. The nodes T24 and T25 are connected by a wiring pattern in the upper wiring line layer in accordance with the logic circuit designed by the user. A MOS transistor with a relatively small size and a relatively small input capacity is used for the MOS transistor of the input terminal of the inverter 32. A MOS transistor with a large size and a large drive ability is used for the transistor of the output terminal. Thus, the optimization of the inverter 32 is accomplished.

Next, a designing system of the present invention will be described below.

The designing system is composed of a processor 102, an input unit 104, a display unit 106, a general-purpose logic cell data storage 108 and a storage unit 110 and a recording medium 112. An arrangement program and a wiring line program are loaded into the storage unit 110 from the recording medium 112. The storage unit 108 stores data of the general-purpose logic cell array, i.e., data of a layout and attributes of the MOS transistors in each of the logic cells, and a layout of connections of the MOS transistors in the lower wiring line layer. The processor 102 reads out the general-purpose logic cell array data from the storage unit 108 and provides it to a user automatically via the Internet or manually. When receiving data of a desired logic circuit from the user automatically via the Internet or manually, the processor 102 starts the arrangement program 110-1 and the wiring line program 110-2 to produce a layout of wiring lines for the upper wiring line layer.

Next, a process to manufacture an ASIC using the general-purpose logic cell array as mentioned above will be described. It should be noted that it is supposed that the general-purpose logic cell 1 shown in FIG. 2 is used as the general-purpose logic cell CELL-B.

First, MOS transistors are formed on a semiconductor substrate, and are electrically connected by a lower wiring line layer of three layers. In this way, as shown in FIG. 9, a lower layer is formed in which three kinds of the general-purpose logic cells such as the general-purpose logic cell CELL-A, the general-purpose logic cell CELL-B and the general-purpose logic cell CELL-C are formed in an array. It should be noted that the number of layers in the lower wiring line layer is not limited to three. The lower wiring line layer may be formed of the optional number of layers in accordance with the structure of each the general-purpose logic cell.

Figure 11:
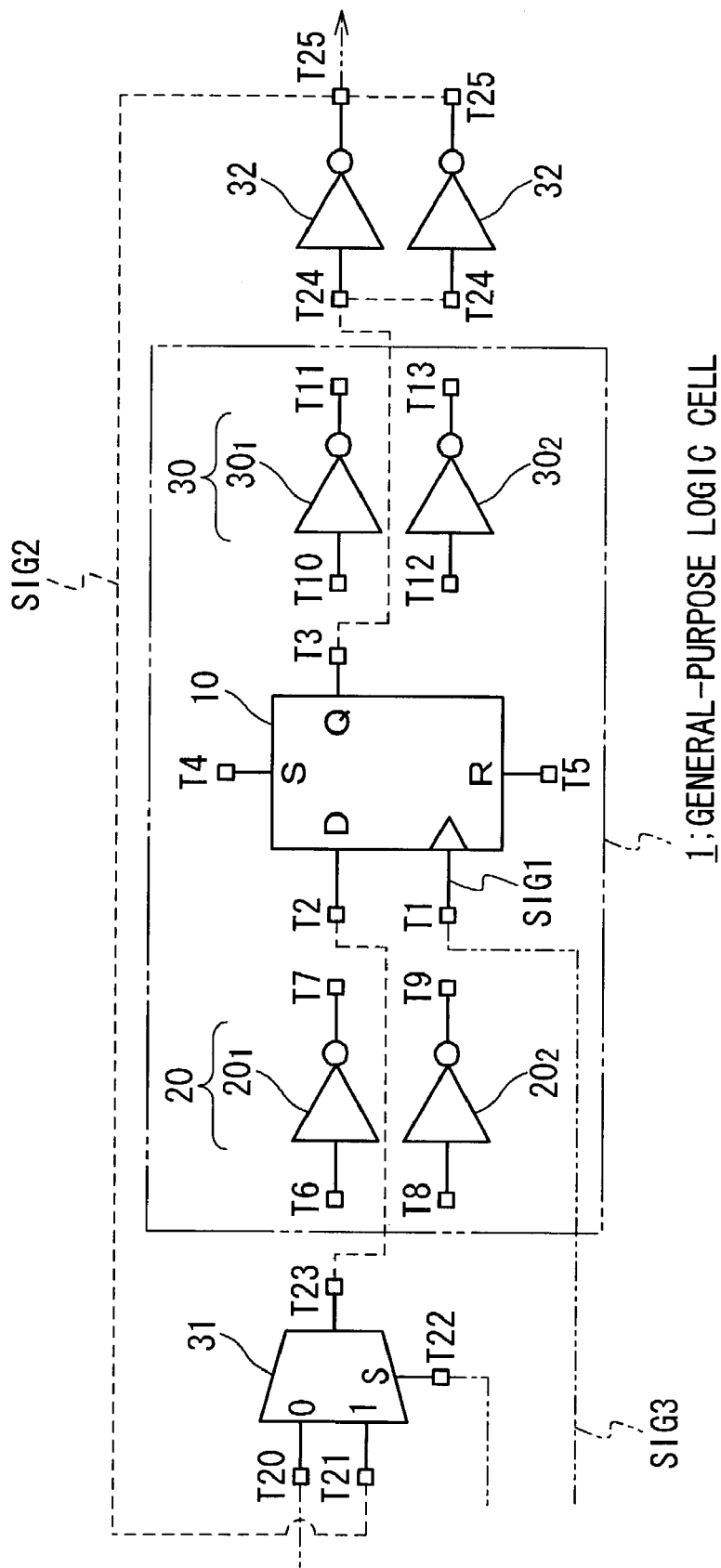
FIG. 11 is a diagram showing the method of manufacturing an ASIC using the general-purpose logic cell array according to the second embodiment of the present invention.
Figure 12:
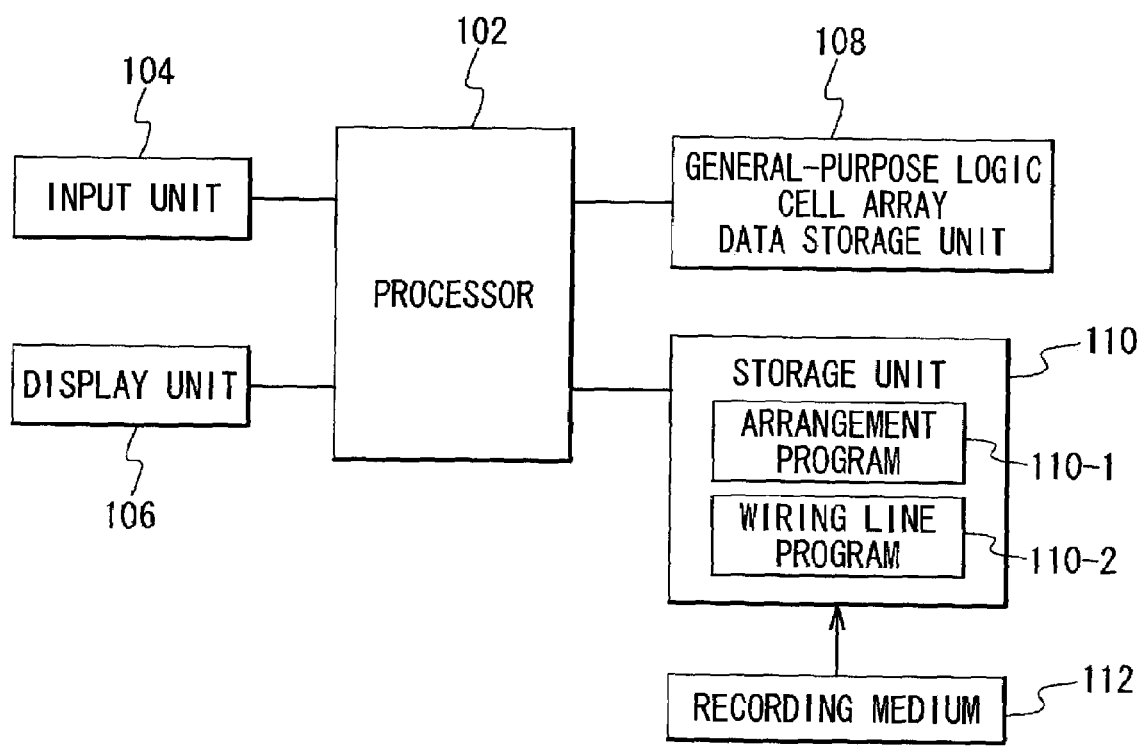
FIG. 12 is a block diagram showing the configuration of a designing system used for an ASIC designing.

Next, the arrangement of the general-purpose logic cells to be used is carried out based on the logic circuit shown from the user. At this time, it is supposed that a function block FB1 of one selector, one flip-flop and two inverters is contained in the logic circuit shown from the user, as shown in FIG. 11.

In order to realize the function block FB1, first, an arrangement process of the general-purpose logic cells is carried out, by using an arrangement program 110-1. In the arrangement process, regions for one selector, one flip-flop and two inverters are secured adjacently to each other in an unused region of the general-purpose logic cell array. For example, one flip-flop and two inverters are arranged for the function block FB1, as shown in FIG. 9 by the slanted lines.

In the same way, the general-purpose logic cells are secured and arranged to realize another function block FB2 and another function block FB3 contained in the logic circuit shown from the user. In the function block FB2, two flip-flops are secured and arranged, and in the function block FB3, three selectors and two flip-flops are secured and arranged.

Next, a wiring process is carried out by using a wiring line program 110-2. That is, a wiring pattern is produced to connect the nodes of the respective general-purpose logic cells, as shown in FIG. 11 by the broken lines. Using a lithography mask on which the produced wiring pattern is baked, the semiconductor manufacturing process is carried out to form the upper wiring line layer on the semiconductor substrate in which the lower layer has the 3-layer lower wiring line layer. Thus, the semiconductor chip is completed in which the logic circuit shown by the user is formed on the general-purpose logic cell array.

It should be noted that the inverters 32 of the general-purpose logic cell CELL-C are used as the inverter in the above-mentioned example. However, the inverters 301 and 302 provided in the general-purpose logic cell 1 as shown in FIG. 5 may be used. In this case, it is possible to shorten a wiring length in accordance with the structure.

When the ASIC is designed by using the general-purpose logic cell array according to the second embodiment of the present invention, the above-mentioned arrangement process and wiring process are carried out to realize the logic circuit shown from the user, and then the wiring pattern of the upper wiring line layer is designed. Through the above, the design of ASIC completes. After that, by using a lithography mask on which the designed wiring line pattern is baked, the semiconductor manufacturing process is carried out in which the upper wiring line layer is formed on the semiconductor substrate as the lower layer with the 3-layer lower wiring line layer. Thus, the semiconductor chip is completed in which the logic circuit shown by the user is formed.

The ASIC which uses the general-purpose logic cell array according to the second embodiment of the present invention is provided to the user in the following ways. For example, a semiconductor maker shows information of the semiconductor substrate in which the 3-layer lower wiring line layer is formed. The user designs a desired logic circuit based on the shown information and requests the manufacturing of semiconductor chips to the semiconductor maker to realize the desired logic circuit. The semiconductor maker designs the upper wiring line pattern of two layers automatically based on the logic circuit design received from the user. Thus, the semiconductor maker manufactures semiconductor chips as mentioned above, and provides them for the user.

As described above, according to the general-purpose logic cell array according to the second embodiment of the present invention, when the logic circuit shown from the user should be realized, the semiconductor maker is sufficient to connect between the nodes of the general-purpose logic cells by the upper wiring line layer which is formed on the semiconductor substrate as the lower layer with the 3-layer lower wiring line layer. Therefore, it is not necessary to carry out all connections in the upper wiring line layer like a cell array of the gate array type. As a result, wiring line resource neck can be eliminated.

Also, the general-purpose logic cell array according to the second embodiment of the present invention is composed of a plurality of kinds of the general-purpose logic cells such as the selector, the flip-flop and the inverter. In addition, the general-purpose logic cell is optimized. Therefore, the optimization can be automatically carried out from the nature of the logic circuit shown by the user, e.g., from the viewpoints of which of a combinational circuit, a sequential circuit and a drive circuit is used the most. In this way, the power consumption, the input capacity, and the drive ability can be optimized by combining a plurality of general-purpose logic cell arrays appropriately.

It should be noted that when many general-purpose logic cells are driven as in case of a clock signal, there is a case that the drive ability is lack, even if an inverter is supposed to be optimized in the drive circuit having only the inverter. In such a case, in the present invention, the drive ability can be improved by connecting two or more inverters in parallel, as shown in FIG. 11. Therefore, the drive ability can be simply optimized.

Also, it should be noted that in the above-mentioned second embodiment, the plurality of general-purpose logic cells are composed of a 2-input multiplexer, a flip-flop (the general-purpose logic cell according to the first embodiment) and an inverter. However, the general-purpose logic cells are not limited to them, and the other various logic circuits may be used as the general-purpose logic cell.

Also, in the above-mentioned embodiment, the general-purpose logic cell array is composed of one or more kinds of the general-purpose logic cells. However, it is possible to contain a semiconductor circuit, such as a CPU, a memory, and analog circuits such as a PLL circuit and an analog-to-digital converter, other than the digital general-purpose logic cells, in a part of the area of the general-purpose logic cell array. In this case, the ASIC can be manufactured on one semiconductor chip to have very many functions.

As described above in detail, according to the present invention, the general-purpose logic cell for developing a semiconductor device, in which a logic circuit designed by a user is incorporated, can be provided in a short time and in a low cost. The general-purpose logic cell array using the general-purpose logic cells, and the ASIC using the general-purpose logic cell array can be provided.

What is claimed is:

1. A general-purpose logic cell used in a general-purpose logic cell array for a logic circuit, said general-purpose logic cell comprising:
   a plurality of kinds of logic circuit elements, each of which has a plurality of terminals with no connection,
   wherein said plurality of kinds of logic circuit elements comprises a flip-flop and a first inverter set, and
   wherein said first inverter set comprises first inverters, each of which is possible to be connected with an input of said flip-flop in parallel or as one of a series connection of at least two of said first inverters.

2. The general-purpose logic cell according to claim 1, wherein an input transistor of each of said first inverters has a smaller size and a smaller capacitance than an output transistor of said flip-flop.

3. The general-purpose logic cell according to claim 1, wherein said plurality of kinds of logic circuit elements further comprises a second inverter set.

4. The general-purpose logic cell according to claim 3, wherein said second inverter set comprises second inverters, each of which is possible to be connected with an output of said flip-flop in parallel or as one of a series connection of at least two of said second inverters.

5. The general-purpose logic cell according to claim 1, wherein each of said first inverters is possible to be connected with an output of said flip-flop in parallel or as one of a series connection of at least two of said first inverters.

6. The general-purpose logic cell according to claim 1, wherein a plurality of logic variations may be achieved by changing a drive ability, a setup time and a hold time of said flip-flop.

7. A general-purpose logic cell used in a general-purpose logic cell array for a logic circuit, said general-purpose logic cell comprising:
   a plurality of kinds of logic circuit elements, each of which has a plurality of terminals with no connection, wherein said plurality of kinds of logic circuit elements comprises a flip-flop, a first inverter set, and a second inverter set, wherein said second inverter set comprises second inverters, each of which is possible to be connected with an output of said flip-flop in parallel or as one of a series connection of at least two of said second inverters, and wherein an output transistor of each of said second inverters has a size and capacitance equal to or larger than an output transistor of said flip-flop.

8. A general-purpose logic cell used in a general-purpose logic cell array for a logic circuit, said general-purpose logic cell comprising:

a plurality of kinds of logic circuit elements, each of which has a plurality of terminals with no connection, wherein said plurality of kinds of logic circuit elements comprises a flip-flop, a first inverter set, and a second inverter set, wherein said second inverter set comprises second inverters, each of which is possible to be connected with an output of said flip-flop in parallel or as one of a series connection of at least two of said second inverters, and wherein said second inverters have different drive abilities.

9. A general-purpose logic cell used in a general-purpose logic cell array for a logic circuit, said general-purpose logic cell comprising:

a plurality of kinds of logic circuit elements, each of which has a plurality of terminals with no connection, wherein said plurality of kinds of logic circuit elements comprises a flip-flop and a first inverter set, wherein said first inverter set comprises first inverters, each of which is possible to be connected with an output of said flip-flop in parallel or as one of a series connection of at least two of said first inverters, and wherein an output transistor of each of said first inverters has a size and capacitance equal to or larger than an output transistor of said flip-flop.

10. A general-purpose logic cell used in a general-purpose logic cell array for a logic circuit, said general-purpose logic cell comprising:

a plurality of kinds of logic circuit elements, each of which has a plurality of terminals with no connection, wherein said plurality of kinds of logic circuit elements comprises a flip-flop and a first inverter set, wherein said first inverter set comprises first inverters, each of which is possible to be connected with an output of said flip-flop in parallel or as one of a series connection of at least two of said first inverters, and wherein said first inverters have different drive abilities.

11. A general-purpose logic cell array for a logic circuit, comprising a plurality of kinds of general-purpose logic cells, wherein each of said plurality of kinds of general-purpose logic cells is arranged in a line in a first direction, said general-purpose logic cell comprises a plurality of kinds of logic circuit elements, each of which has a plurality of terminals with no connection, wherein said plurality of kinds of logic circuit elements comprises a flip-flop and a first inverter set, and wherein said first inverter set comprises first inverters, said first inverters having different drive abilities.

12. The general-purpose logic cell array according to claim 11, wherein said plurality of kinds of general-purpose logic cells are circularly arranged in a second direction orthogonal to the first direction.

13. The general-purpose logic cell array according to claim 11, wherein one of said plurality of kinds of general-purpose logic cells is a selector with a middle signal terminal.

14. The general-purpose logic cell according to claim 11, wherein said first inverter set comprises first inverters, each of which is possible to be connected with an input of said flip-flop in parallel or as one of a series connection of at least two of said first inverters.

15. The general-purpose logic cell according to claim 11, wherein said plurality of kinds of logic circuit elements further comprises a second inverter set.

16. The general-purpose logic cell according to claim 15, wherein said second inverter set comprises second inverters, each of which is possible to be connected with an output of said flip-flop in parallel or as one of a series connection of at least two of said second inverters.

17. The general-purpose logic cell according to claim 11, wherein said first inverter set comprises first inverters, each of which is possible to be connected with an output of said flip-flop in parallel or as one of a series connection of at least two of said first inverters.

18. A general-purpose logic cell used in a general-purpose logic cell array for a logic circuit, said general-purpose logic cell comprising:

a plurality of kinds of logic circuit elements, each of which has a plurality of terminals with no connection, wherein said plurality of kinds of logic circuit elements comprises a flip-flop and at least one inverter set, said at least one inverter set including inverters having different drive abilities.

19. A general-purpose logic cell array for a logic circuit, comprising a plurality of kinds of general-purpose logic cells, wherein each of said plurality of kinds of general-purpose logic cells is arranged in a line in a first direction, said general-purpose logic cell comprises a plurality of kinds of logic circuit elements, each of which has a plurality of terminals with no connection, wherein said plurality of kinds of logic circuit elements comprises a flip-flop and a first inverter set, and wherein said first inverter set comprises first inverters, each of which is possible to be connected with an input of said flip-flop in parallel or as one of a series connection of at least two of said first inverters.

* * * * *